United States Patent [19]

Marcus et al.

[11] 4,342,795

[45] Aug. 3, 1982

[54] SOLAR CELL METALLIZATIONS COMPRISING A NICKEL-ANTIMONY ALLOY

[75] Inventors: Sanford M. Marcus, Wilmington; Joseph R. Rellick, Newark, both of Del.

[73] Assignee: E. I. Du Pont de Nemours and Company, Wilmington, Del.

[21] Appl. No.: 218,493

[22] Filed: Dec. 19, 1980

[51] Int. Cl.³ .......................... B05D 3/02; C23C 17/00
[52] U.S. Cl. ..................................... 427/75; 106/1.05; 106/1.27; 427/74

[58] Field of Search ................... 427/75, 74; 106/1.05, 106/1.27

[56] References Cited

U.S. PATENT DOCUMENTS

| | | | |
|---|---|---|---|
| 2,884,344 | 4/1959 | Ramirez | 427/438 |
| 4,172,919 | 10/1979 | Mitchell | 428/433 X |
| 4,199,417 | 4/1980 | Borruso | 204/44 |
| 4,235,644 | 11/1980 | Needes | 427/75 X |

Primary Examiner—James R. Hoffman

[57] ABSTRACT

A silicon solar cell is metallized with a nickel-antimony alloy to provide external contacts.

6 Claims, No Drawings

SOLAR CELL METALLIZATIONS COMPRISING A NICKEL-ANTIMONY ALLOY

FIELD OF THE INVENTION

This invention relates to solar cells, to means for making external contacts to them, and to compositions utilized in making such external contacts.

BACKGROUND OF THE INVENTION

Solar cells are well known. A common form of such a cell comprises a wafer of P-type silicon having diffused into one side thereof a doping material such as phosphorus to create a thin N-type silicon layer in the region of the diffusion. This creates a P-N junction near the surface. The action of light directed on such a surface creates a voltage in the region of the junction in a well known manner. In order to utilize the power thus generated, contact must be made to the P-type silicon and also to the N-type silicon, and both contacts must be connected through an external circuit. Such contacts are made by depositing a metal coating on the P-type layer, and one on the opposite side, viz. the N-type layer. Such coatings are commonly referred to as metallizations.

In order for photovoltaic (solar) cells to compete economically as energy sources, reduction in both materials costs and fabrication costs is essential. Cell metallizations constitute a significant portion of total systems costs because they are generally based on expensive palladium and silver compositions applied by cost intensive vacuum deposition techniques. There is a need for metallizations comprised of inexpensive base metals which can be applied economically by thick film techniques and assembled reliably by soldering.

SUMMARY OF INVENTION

Thick film compositions (printing pastes or inks applied through a screen) based on alloys of nickel and antimony, and optionally containing glass frits, are applied to the N-type region of a silicon solar cell (generally the front surface facing the incident sunlight) and fired in a nitrogen or other inert atmosphere to yield a solar cell with characteristics satisfactory for a wide range of applications.

DETAILED DESCRIPTION OF INVENTION

Desirable properties of front surface metallizations are tabulated in Table I below:

TABLE I

| Property | Attribute |
|---|---|
| Penetrate anti-reflection coating on front surface of solar cell | No need for etching step |
| Base metal | Low cost |
| Low contact resistance | Low power loss |
| Shallow diffusion | Does not short P/N junction |
| Good adhesion | Stability over use |
| Good solderability | Low resistivity and low cost cell interconnections |
| Fine line patterning | Increases efficiency by maximizing front surface collection area |

The Examples set forth below illustrate the use of thick film compositions of this invention which attain the desirable metallization properties enumerated in Table I above.

EXAMPLE I

An alloy of nickel and antimony (NiSb) was prepared by melting together in an argon atmosphere 134 grams of 99.8% lump antimony (Fisher certified Grade A-846) and 66 grams of 99.9% Ni powder (Cerac Stock #N-1022) in a high purity alumina crucible. The resultant brittle intermetallic compound was comminuted to a powder in which substantially all the particles were less than 10 microns in size. X-ray diffraction analysis of the powder confirmed that it was the compound NiSb; no other phases were detected. A small piece of the original ingot was found to be readily solderable in 62 Sn-36 Pb-2 silver solder using a type RMA flux (rosin, mildly activated).

A paste was formulated comprising 88% of the NiSb powder and 12% of powdered glass (frit), the percentage being in % by weight of the alloy/glass mixture. This glass has the following composition, in % by wt.:

| | |
|---|---|
| 83.00 | PbO |
| 11.00 | $B_2O_3$ |
| 4.90 | $PbF_2$ |
| 1.10 | $SiO_2$ |

Sufficient vehicle (ethyl cellulose in a dibutyl phthalate/terpineol solvent) was added to make a printable paste. This paste was screen printed on the front surface of a solar cell blank of P-type silicon containing a thin region of N-type conductivity on the front face extending 0.4 to 0.5 microns into the cell. Solar cells both with and without anti-reflection coatings of $Si_3N_4$ were used. Printed samples were fired in a nitrogen atmosphere conveyor furnace, attaining a peak temperature of either 500°, 600° or 650° C. with a dwell time of about 6 minutes at peak. After firing, samples were evaluated (1) for cohesion and adhesion by scraping with a sharp probe, (2) for solderability in 62 Sn-36 P-2 Ag solder using a flux of 20 percent of tartaric acid and 80% ethylene glycol and (3) for the following electrical properties, making use of a Tektronics' curve tracer 576: (This is equipment for applying a time dependent voltage across the device to be measured while simultaneously displaying this and the current through the device on a cathode ray tube)

$V_{OC}$ = open circuit voltage
FF = fill factor
$R_S$ = series resistance
$R_{SH}$ = shunt resistance The electrical characteristics of solar cells fabricated using this formulation are listed below:

| Cell | Firing Temp | $V_{oc}$ (mv) | FF | $R_S$ | $R_{SH}$ |
|---|---|---|---|---|---|
| No coating | 600° C. | 560 | 0.48 | 1.0 | Infinite |
| $Si_3N_4$ anti-reflection coating | 550° C. | 580 | 0.57 | 1.7 | Infinite |

EXAMPLE II

Thick film formulations of several alloys of the Ni-Sb system were tested with 12% of the glass used in Example I on N- and P-type bulk silicon. Table II lists the characteristics of the resulting metallizations, including adhesion of the alloys to the substrate, solderability and electrical behavior. Ideally these alloys should exhibit high resistance on P-type substrates, whereas low resistances characteristic of the bulk properties of the substrate (approximately 100 milliohm) should be found on these N-type silicon substrates. This behaviour indicates nondisruptive alloying of the fired pastes to the substrate. NiSb is shown to have the best overall characteristics in contact resistance, resistivity, adhesion and solderability.

ganic binder which bonds the metal particles to one another and to the substrate.

We claim:

1. A thick film composition suitable for the metallization of a silicon solar cell which comprises an alloy of nickel and antimony dispersed in particle form in an organic vehicle in a concentration sufficient to make a printable paste.

2. The thick film composition of claim 1 wherein the alloy is the intermetallic compound NiSb.

3. The thick film composition of claim 1 which additionally contains glass frits.

TABLE II

Data below:
S indicates good soldering
P indicates poor soldering
A indicates good adhesion
Numbers in table are in ohms/sq. for resistivity of metallization material
Numbers in table are in ohms/sq. for contact resistance of termination to bulk silicon

| | Contact Resistance of Termination to Bulk Silicon (N or P-type respectively) | | | | | | Resistivity of Metallization Material: $N/P = \frac{\text{on N substrate}}{\text{on P substrate}}$ | | |
|---|---|---|---|---|---|---|---|---|---|
| | N | | | P | | | | | |
| | 550° C. | 600° C. | 650° C. | 550° C. | 600° C. | 650° C. | 550° C. | 600° C. | 650° C. |
| Ni Powder | A | A | A | A | A | A | | | |
| | P | S | S | — | — | — | | | |
| | 9.2 | 5.2 | 10 | 670 | 195 | 122 | .025/.023 | .010/.007 | .007/.006 |
| NiSb | A | A | A | A | A | A | | | |
| | P | S | S | — | — | — | | | |
| | 1 | .100 | .200 | 370 | 110 | 160 | .020/.015 | .008/.020 | .007/.007 |
| Ni₃Sb | A | A | A | A | A | A | | | |
| | P | S | S | — | — | — | | | |
| | .560 | .110 | .110 | 180 | 41 | 14 | .037/.031 | .009/.021 | .036/.015 |

The foregoing Examples should be considered as illustrative, not limiting. For example, while screen printing is disclosed above, other methods of application to the substrate such as brushing, spraying, stamping, etc. could be used. The organic vehicle employed in the printing paste is generally employed in an amount such that the printing paste will contain 70–90% solids and 10–30% vehicle. A number of inert liquid vehicles commonly used in the art are described in greater detail in U.S. Pat. No. 4,172,919, column 4, lines 3–28, which lines are incorporated by reference herein. Glass compositions other than those of Example 1 could also be employed so long as they serve the function of an inor- 4. The thick film composition of claim 3 wherein the glass frits are present in minor amount, relative to the alloy.

5. The thick film composition of claim 4 wherein the alloy/glass ratio is 88/12 in % by wt of the alloy/glass mixture.

6. A process of metallizing a silicon solar cell having the N-type and a P-type region, comprising screen printing the N-type region of the solar cell with the thick film composition of claims 1, 2, 3, 4, or 5, and firing to a temperature within the range of 500°–650° C. in an inert atmosphere with a dwell time of about 6 minutes at peak.

* * * * *